United States Patent
Suzuki

(10) Patent No.: US 9,453,891 B2
(45) Date of Patent: Sep. 27, 2016

(54) MAGNETIC FIELD DETECTION DEVICE

(71) Applicant: OLYMPUS CORPORATION, Tokyo (JP)

(72) Inventor: Yusuke Suzuki, Hachioji (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 15/046,505

(22) Filed: Feb. 18, 2016

(65) Prior Publication Data

US 2016/0161573 A1 Jun. 9, 2016

Related U.S. Application Data

(63) Continuation of application No. PCT/JP2014/081786, filed on Dec. 1, 2014.

(30) Foreign Application Priority Data

Dec. 13, 2013 (JP) .................................. 2013-258652

(51) Int. Cl.
*G01R 33/06* (2006.01)
*G01R 33/36* (2006.01)
*G01R 33/022* (2006.01)
*G01R 33/20* (2006.01)

(52) U.S. Cl.
CPC ............ *G01R 33/063* (2013.01); *G01R 33/022* (2013.01); *G01R 33/3628* (2013.01); *G01R 33/20* (2013.01)

(58) Field of Classification Search
CPC .............. G01R 33/063; G01R 33/022; G01R 33/0029; G01R 33/20; G01R 33/3628
See application file for complete search history.

(56) References Cited

U.S. PATENT DOCUMENTS

| 4,885,541 A * | 12/1989 | Hayes ................ G01R 33/3415 324/322 |
| 2002/0013525 A1* | 1/2002 | Scott .................... G01R 33/285 600/410 |
| 2012/0206143 A1* | 8/2012 | McGushion ......... G01R 33/022 324/318 |
| 2013/0225927 A1 | 8/2013 | Sato et al. |

FOREIGN PATENT DOCUMENTS

| JP | 2001-116783 A | 4/2001 |
| JP | 2001-311750 A | 11/2001 |
| JP | 2003-202616 A | 7/2003 |
| JP | 2005-086348 A | 3/2005 |
| JP | 2012-029972 A | 2/2012 |
| JP | 2012-081016 A | 4/2012 |
| JP | 2013-160533 A | 8/2013 |

OTHER PUBLICATIONS

International Search Report dated Feb. 10, 2015 issued in PCT/JP2014/081786.

* cited by examiner

*Primary Examiner* — Jermele M Hollington
*Assistant Examiner* — Dustin Dickinson
(74) *Attorney, Agent, or Firm* — Scully, Scott, Murphy & Presser, P.C.

(57) ABSTRACT

A magnetic field detection device includes: a resonance circuit having a winding coil for converting a magnetic field signal of an alternating magnetic field into a voltage signal and having a capacitor connected in parallel to the coil; an element connected in series to an output stage of the resonance circuit; and a low noise amplifier connected to an output stage of the element. The element has a reactance whose sign is opposite to that of an imaginary part of an impedance of the resonance circuit at a detected frequency of the alternating magnetic field. An absolute value of a combined impedance of the resonance circuit and the element is smaller than an internal resistance of the coil.

6 Claims, 4 Drawing Sheets

MAGNETIC FIELD DETECTION DEVICE

CROSS-REFERENCE TO RELATED APPLICATIONS

This application is a continuation of PCT international application Ser. No. PCT/JP2014/081786 filed on Dec. 1, 2014 which designates the United States, incorporated herein by reference, and which claims the benefit of priority from Japanese Patent Application No. 2013-258652, filed on Dec. 13, 2013, incorporated herein by reference.

BACKGROUND

1. Technical Field

The disclosure relates to a magnetic field detection device for detecting weak magnetic fields.

2. Related Art

There is known a position measurement technique for measuring a position of a detection target by detecting a weak magnetic field generated by the detection target. For example, in the field of endoscope, there has been developed a position detecting system for measuring a position of a capsule endoscope inside a subject by attaching a marker coil for generating an alternating magnetic field to the inside of a capsule endoscope that can be introduced into an alimentary tract of a subject, and by detecting the alternating magnetic field generated by the marker coil by a magnetic field detection device that is provided outside the subject.

According to such a position detecting system, since the strength of the alternating magnetic field that is generated by the marker coil is weak, the signal detection sensitivity (the S/N ratio of a detection signal) of the magnetic field detection device has to be increased in order to increase the accuracy of position detection for the capsule endoscope.

As examples of high-sensitivity magnetic field detection device, there are known a SQUID fluxmeter that uses a superconducting quantum interference effect, a GMR magnetic sensor that uses a giant magneto resistive effect, and the like. These magnetic field detection devices use self-excitation to increase sensitivity, but generally, the circuit configuration for self-excitation is complicated.

As a technique related to enhancement of detection sensitivity, Japanese Laid-open Patent Publication No. 2001-116783 discloses a method for detecting infinitesimal capacity change and a detection circuit which are for detecting an infinitesimal change in capacitance of a capacitor microphone. Also, Japanese Laid-open Patent Publication No. 2012-29972 discloses a technology for reducing real resistance components that increase due to occurrence of eddy current in a detection coil of a magnetic field detection device.

SUMMARY

In some embodiments, a magnetic field detection device includes: a resonance circuit having a winding coil for converting a magnetic field signal of an alternating magnetic field into a voltage signal and having a capacitor connected in parallel to the coil; an element connected in series to an output stage of the resonance circuit; and a low noise amplifier connected to an output stage of the element. The element has a reactance whose sign is opposite to that of an imaginary part of an impedance of the resonance circuit at a detected frequency of the alternating magnetic field. An absolute value of a combined impedance of the resonance circuit and the element is smaller than an internal resistance of the coil.

The above and other features, advantages and technical and industrial significance of this invention will be better understood by reading the following detailed description of presently preferred embodiments of the invention, when considered in connection with the accompanying drawings.

DETAILED DESCRIPTION

Figure 1:
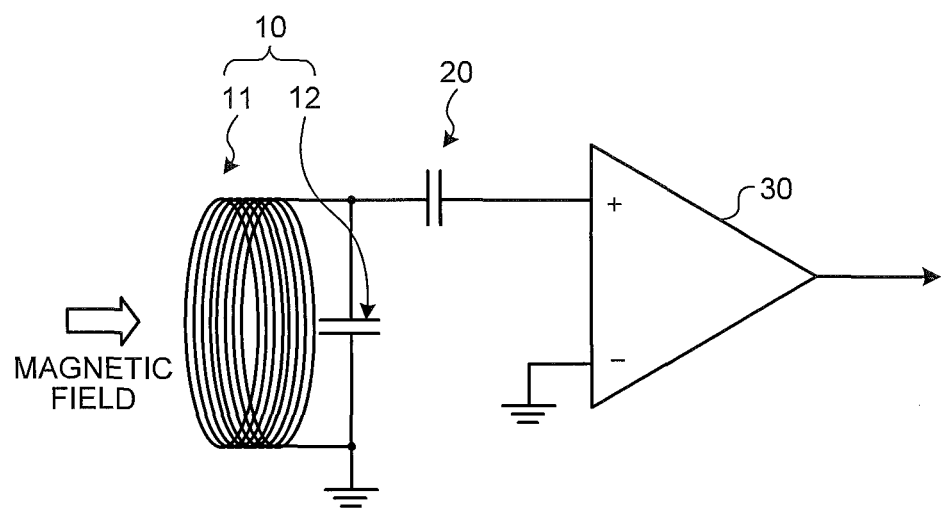
FIG. 1 is a schematic diagram illustrating an example configuration of a magnetic field detection device according to a first embodiment of the present invention.

Hereinafter, magnetic field detection devices according to some embodiments of the present invention will be described with reference to the drawings. In the following description, the shapes, sizes and positional relationships are schematically illustrated in the drawings merely to allow understanding of the contents of the present invention. Accordingly, the present invention is not limited to the shapes, sizes and positional relationships exemplified in the drawings. The same reference signs are used to designate the same elements throughout the drawings.

First Embodiment

Figure 2:
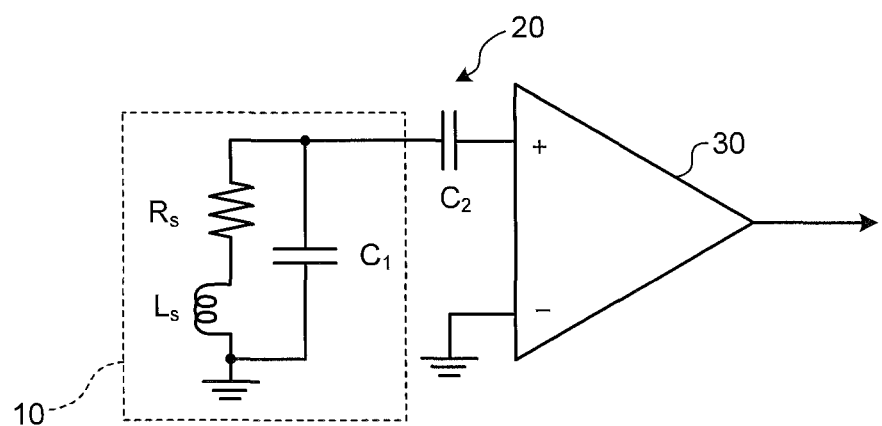
FIG. 2 is a diagram illustrating an equivalent circuit of the magnetic field detection device illustrated in FIG. 1.

FIG. 1 is a schematic diagram illustrating an example configuration of a magnetic field detection device according to a first embodiment of the present invention. Also, FIG. 2 is a diagram illustrating an equivalent circuit of the magnetic field detection device illustrated in FIG. 1. As illustrated in FIG. 1, a magnetic field detection device 1 according to the first embodiment is a device for receiving an alternating magnetic field and for converting a magnetic field signal into an electrical signal, and includes a resonance circuit 10, a capacitor 20 that is an element connected in series to the output stage of the resonance circuit 10, and a low noise amplifier 30 that is connected to the output stage of the capacitor 20.

The resonance circuit 10 is formed from a winding, and includes a coil 11 for converting a received magnetic field signal into a voltage signal, and a capacitor 12 that is connected in parallel to the coil 11. In the following, as illustrated in FIG. 2, the internal resistance of the coil 11 is denoted by $R_S$, the self-inductance is denoted by $L_S$, and the capacitance of the capacitor 12 is denoted by $C_1$. Also, the impedance of the resonance circuit 10 is denoted by $Z_1$.

As the element connected to the output stage of the resonance circuit 10, any of a capacitor, a coil, a resistor and the like may be employed as long as the element has a reactance whose sign is opposite to that of an imaginary part $Im[Z_1]$ of the impedance $Z_1$ of the resonance circuit 10 at a frequency (detected frequency $f_{det}$) of an alternating magnetic field which is a detection target of the magnetic field detection device 1. In the first embodiment, the capacitor 20 is used for such an element. In the following, the capacitance of the capacitor 20 will be denoted by $C_2$.

The low noise amplifier 30 amplifies a voltage signal which has been converted by the coil 11 from a magnetic field signal and which has been input via the capacitor 20.

Figure 3:
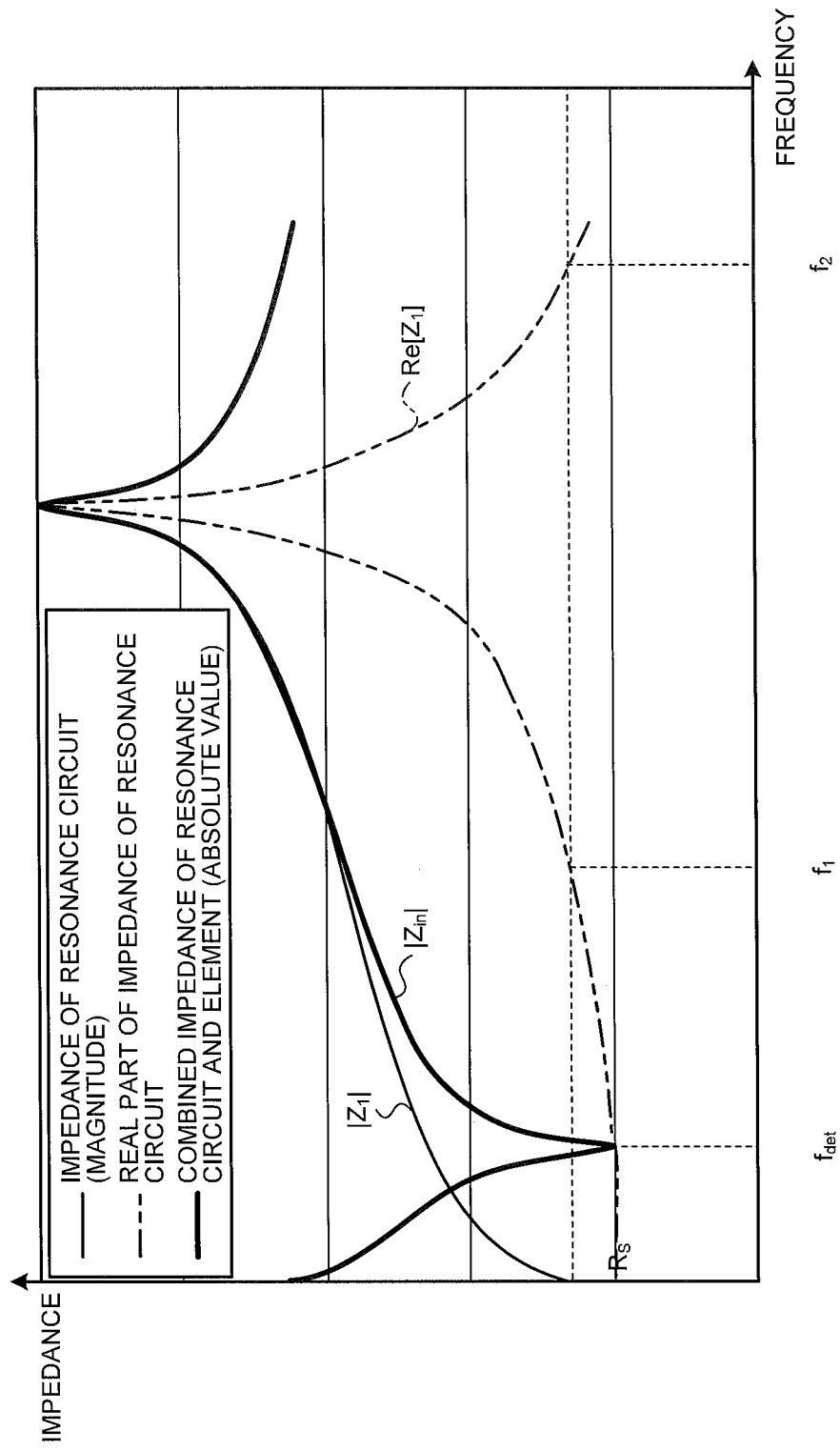
FIG. 3 is a graph illustrating impedance frequency characteristics of the magnetic field detection device illustrated in FIG. 1.

Next, conditions of characteristic values of units configuring the magnetic field detection device 1 will be described with reference to FIG. 3. First, a noise level $N_m$ of the magnetic field detection device 1 is given by the following expression (1).

$$N_m = \sqrt{V_n^2 + (|Z_{in}|I_n)^2 + (4kT \cdot Re[Z_{in}])} \tag{1}$$

In expression (1), $V_n$ denotes the voltage noise of the low noise amplifier 30, $I_n$ denotes the current noise of the low noise amplifier 30, and $Z_{in}$ denotes the input impedance seen from the low noise amplifier 30, that is, the combined impedance of the resonance circuit 10 and the capacitor 20. Also, "k" denotes the Boltzmann constant, "T" denotes the absolute temperature, and $Re[Z_{in}]$ denotes the real part of the combined impedance $Z_{in}$.

Now, in order to increase the detection sensitivity for a magnetic field, the number of turns and the area of a magnetic field detection surface (opening surface) of the coil 11 have to be increased. On the other hand, if the number of turns and the opening surface of the coil 11 are increased, the internal resistance $R_S$ of the coil 11 is increased, and thus the thermal noise components $4kT \cdot Re[Z_{in}]$ in expression (1) are increased.

Accordingly, in the first embodiment, the thermal noise components are reduced by setting the characteristics of the capacitor 12 and the capacitor 20.

If the reactance of the coil 11 is given by $X_S = \omega L_S$, and the reactance of the capacitor 12 is given by $X_1 = 1/\omega C_1$, the impedance $Z_1$ of the resonance circuit 10 is given by the following expression (2). Here, $\omega$ is $2\pi f_{det}$, and "j" denotes an imaginary unit.

$$Z_1 = \frac{R_S X_1^2 + jX_1(X_S X_1 - R_S^2 - X_S^2)}{R_S^2 + (X_S - X_1)^2} \tag{2}$$

Also, if the reactance of the capacitor 20 is given by $X_2 = 1/\omega C_2$, the combined impedance $Z_{in}$ of the resonance circuit 10 and the capacitor 20 is given by the following expression (3).

$$Z_{in} = Z_1 - jX_2 \tag{3}$$

According to expression (1), in order to reduce the noise level $N_m$, the combined impedance $Z_{in}$ may be reduced. For this purpose, the imaginary part $Im[Z_1]$ of the impedance $Z_1$ of the resonance circuit 10 is to be reduced by the reactance of the element connected to the output stage of the resonance circuit 10. Therefore, in the first embodiment, the capacitor 20 having a reactance whose sign is opposite to that of the imaginary part $Im[Z_1]$ of the impedance $Z_1$ of the resonance circuit 10 is used at the output stage of the resonance circuit 10.

More preferably, a magnitude of the reactance $X_2$ of the capacitor 20 is equal to a magnitude of the imaginary part $Im[Z_1]$ of the impedance $Z_1$ of the resonance circuit 10. The imaginary part $Im[Z_1]$ is thereby cancelled, and the absolute value of the combined impedance $Z_{in}$ may be minimized.

This condition is given by the following expression (4).

$$X_2 = \frac{X_1(X_S X_1 - R_S^2 - X_S^2)}{R_S^2 + (X_S - X_1)^2} \tag{4}$$

Here, the combined impedance $Z_{in}$ is given by the following expression (5).

$$Z_{in} = \frac{R_S X_1^2}{R_S^2 + (X_S - X_1)^2} \tag{5}$$

On the other hand, the noise level $N_m$ may be reduced when the absolute value $|Z_{in}|$ of the combined impedance is smaller than the internal resistance $R_S$ of the coil 11. In more detail, when the real part $Re[Z_{in}]$ of the combined impedance is smaller than the internal resistance $R_S$ of the coil 11, the thermal noise components $4kT \cdot Re[Z_{in}]$ in expression (1) may be reduced. According to expression (3), if the element connected to the output stage of the resonance circuit 10 is the capacitor 20, $Re[Z_{in}]$ is equal to $Re[Z_1]$, and thus the range that satisfies this condition is a range below a frequency $f_1$ illustrated in FIG. 3, or a range above a frequency $f_2$.

A conditional expression (6) for reducing the thermal noise and for minimizing the noise level $N_m$ may thus be obtained.

$$R_S > \frac{R_S X_1^2}{R_S^2 + (X_S - X_1)^2} \tag{6}$$

$$R_S^2 + X_S^2 > 2X_S X_1$$

When this conditional expression (6) is expressed using the self-inductance $L_S$ of the coil 11 and the capacitance $C_1$ of the capacitor 12, the following expression (6') is obtained.

$$R_S^2 + X_S^2 > \frac{2L_S}{C_1} \tag{6'}$$

The $R_S^2 + X_S^2$ on the left side of expression (6') corresponds to the square of the magnitude of the impedance of the coil 11. Accordingly, by setting the capacitance $C_1$ of the capacitor 12 at the detected frequency $f_{det}$ so as to satisfy the following expression (7), the resistance component (real part) of the combined impedance $Z_{in}$ may be made smaller than the internal resistance $R_S$ of the coil 11, and the thermal noise components may be reduced.

$$|\text{Impedance of coil}| > \sqrt{\frac{2L_S}{C_1}} \tag{7}$$

As described above, according to the first embodiment, by using the capacitor 20 having a reactance whose sign is opposite to that of the imaginary part of the impedance of the resonance circuit 10, the noise level of the magnetic field detection device 1 may be reduced. Desirably, by making a magnitude of the reactance of the capacitor 20 equal to a magnitude of the imaginary part of the impedance of the resonance circuit 10, the combined impedance of the resonance circuit 10 and the capacitor 20 may be minimized, and thus the noise level may be further reduced. In addition, by setting the capacitance of the capacitor 12 so as to satisfy expression (7), the thermal noise components may be reduced. Accordingly, even if the number of turns and the area of the opening surface of the coil 11 are increased to enhance the sensitivity, the noise level may be suppressed to a low level, and a magnetic field may be detected at a high S/N ratio.

First Modification

In the first embodiment described above, the capacitor 20 is used as the element connected to the output stage of the resonance circuit 10, but a coil, a resistor or the like may be alternatively employed as long as the element has a reactance whose sign is opposite to that of the imaginary part of the impedance of the resonance circuit 10. For example, depending on conditions of characteristics of the coil 11 and the capacitor 12, the sign of the imaginary part of the impedance of the resonance circuit 10 may become negative. In this case, a coil may be separately connected to the output stage of the resonance circuit 10.

Second Embodiment

Next, a second embodiment of the present invention will be described.

Figure 4:
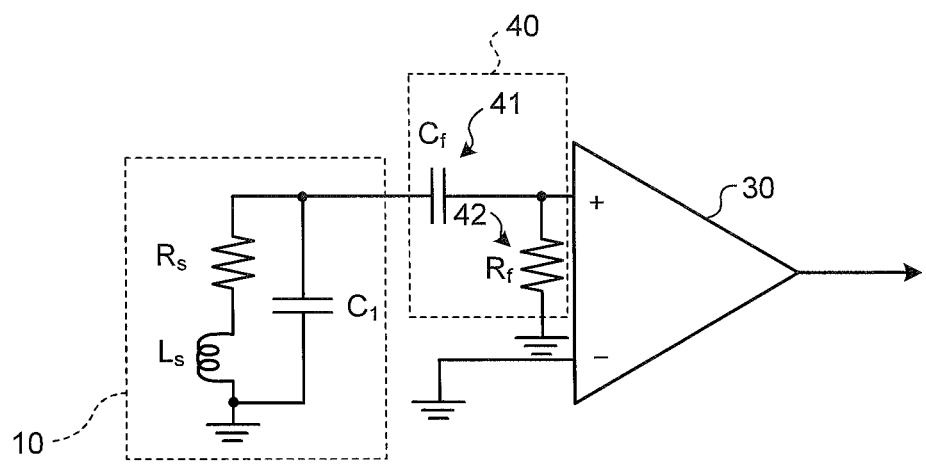
FIG. 4 is a diagram illustrating an equivalent circuit of a magnetic field detection device according to a second embodiment of the present invention.

FIG. 4 is a diagram illustrating an equivalent circuit of a magnetic field detection device according to the second embodiment of the present invention. As illustrated in FIG. 4, with a magnetic field detection device 2 according to the second embodiment, an element 40 including a capacitor 41 and a resistor 42 is adopted, instead of the capacitor 20 illustrated in FIG. 1, as the element connected in series to the output stage of the resonance circuit 10. The configuration of the magnetic field detection device 2 other than the element 40 is the same as that in the first embodiment. In the following, the capacitance of the capacitor 41 will be denoted by $C_f$, and the resistance value of the resistor 42 will be denoted by $R_f$.

Of the element 40, the capacitor 41 is connected in series to the resonance circuit 10, and like the capacitor 20 in the first embodiment, the capacitor 41 acts as a reactance whose sign is opposite to that of the imaginary part of the impedance of the resonance circuit 10. Desirably, an element having a reactance whose magnitude is equal to a magnitude of the imaginary part of the impedance of the resonance circuit 10 is used as the capacitor 41.

On the other hand, the resistor 42 is connected in parallel to the resonance circuit 10. Accordingly, the combined resistance of the resonance circuit 10 and the entire element 40 is smaller than the resistance component of the resonance circuit 10. Thus, the noise level $N_m$ of a signal to be input to the low noise amplifier 30 may be even more reduced than in the case of the first embodiment.

Furthermore, in this case, the element 40 also acts as a low-cut (high-pass) filter. Accordingly, by setting a capacitance $C_f$ and a resistance value $R_f$ as appropriate, it is possible to selectively detect only the magnetic field in a high frequency band at or above a specific frequency ($f_c = 1/2 \pi R_f C_f$).

As described above, according to the second embodiment, a magnetic field at or above a specific frequency may be selectively detected while reducing the noise level.

Second Modification

In the second embodiment, by setting the capacitance $C_f$ and the resistance value $R_f$ as appropriate, the element 40 may be used as a high-cut (low-pass) filter for selectively detecting a magnetic field in a low frequency band at or below a specific frequency.

Third Modification

In the second embodiment, if the sign of the imaginary part of the impedance of the resonance circuit 10 becomes negative due to the conditions such as characteristics of the coil 11 and the capacitor 12 (see FIG. 1), the sign of the reactance may be made opposite (positive) by connecting a coil instead of the capacitor 41.

Fourth Modification

Figure 5:
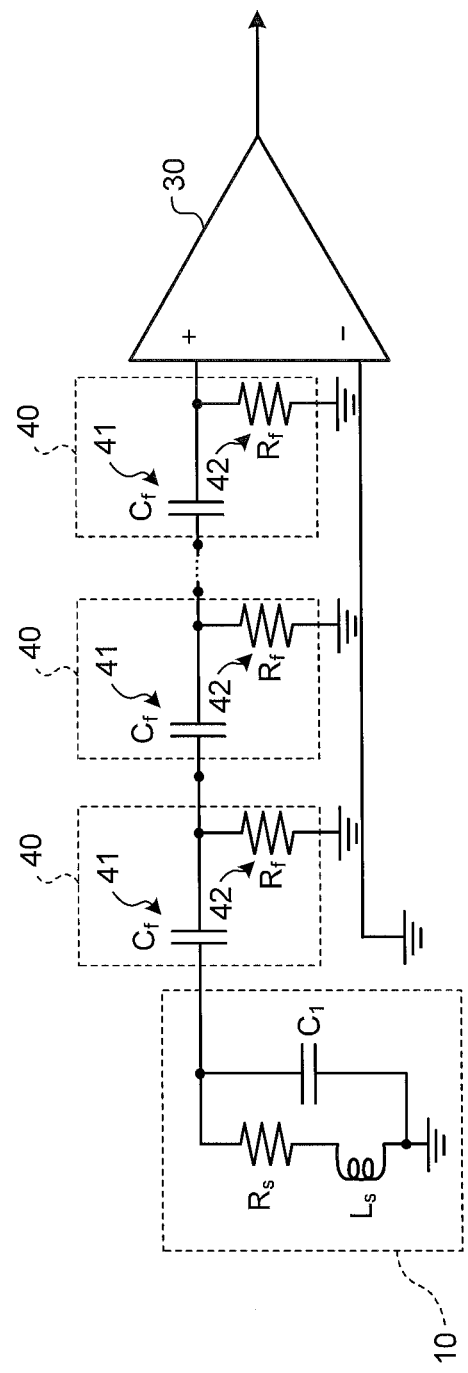
FIG. 5 is a diagram illustrating an equivalent circuit of a magnetic field detection device according to a fourth modification of the second embodiment of the present invention.

FIG. 5 is a diagram illustrating an equivalent circuit of a magnetic field detection device according to a fourth modification of the second embodiment. In the fourth modification, the element 40 described in the second embodiment is provided at multiple stages. In this case, the number of the resistors 42 connected in parallel to the resonance circuit 10 is increased, and the combined resistance component of the resonance circuit 10 and the multiple elements 40 is reduced accordingly, and thus the noise level of a signal input to the low noise amplifier 30 can be further reduced. Also, in this case, steep filter characteristics may be obtained, and thus a subtle change in the signal may be detected.

According to some embodiments, an element having a reactance whose sign is opposite to that of an imaginary part of an impedance of a resonance circuit is connected to the resonance circuit, and an absolute value of a combined impedance of the resonance circuit and the element is smaller than an internal resistance of a coil of the resonance circuit. With this configuration, even if the number of turns or an area of an opening surface of the coil is increased, the thermal noise occurring at the coil can be suppressed, and the noise level can be reduced. Accordingly, it is possible to achieve a magnetic field detection device capable of detecting an alternating magnetic field at a high S/N ratio.

The first embodiment, the second embodiment, and the first to the fourth modifications described above are merely examples for carrying out the present invention, and the present invention is not limited to these embodiments and modifications. Also, various inventions may be derived from the present invention by appropriately combining a plurality of structural elements disclosed in the first embodiment, the second embodiment, and the first to the fourth modifications. The present invention may be changed in various ways according to the specifications and the like, and moreover, it is obvious from the description given above that various other modes are possible within the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic field detection device comprising:
   a resonance circuit having a winding coil for converting a magnetic field signal of an alternating magnetic field into a voltage signal and having a capacitor connected in parallel to the coil;
   an element connected in series to an output stage of the resonance circuit; and
   a low noise amplifier connected to an output stage of the element, wherein the element has a reactance whose sign is opposite to that of an imaginary part of an impedance of the resonance circuit at a detected frequency of the alternating magnetic field, and an absolute value of a combined impedance of the resonance circuit and the element is smaller than an internal resistance of the coil.

2. The magnetic field detection device according to claim 1, wherein a magnitude of an impedance of the coil is greater than $\sqrt{(2\ L_s/C_1)}$ where a self-inductance of the coil is denoted by $L_s$ and a capacitance of the capacitor is denoted by $C_1$.

3. The magnetic field detection device according to claim 1, wherein a magnitude of the reactance of the element at the detected frequency is equal to a magnitude of the imaginary part of the impedance of the resonance circuit.

4. The magnetic field detection device according to claim 1, wherein the element includes at least one of a second capacitor, a second winding coil, and a resistor.

5. The magnetic field detection device according to claim 4, wherein the element includes the second capacitor connected in series to the resonance circuit, and includes the resistor that is provided between the second capacitor and the low noise amplifier and is connected in parallel to the resonance circuit.

6. The magnetic field detection device according to claim 5, wherein the element constitutes a filter for cutting off an electrical signal in a predetermined frequency band.

* * * * *